United States Patent [19]

Ariizumi et al.

[11] Patent Number: 4,544,941
[45] Date of Patent: Oct. 1, 1985

[54] SEMICONDUCTOR DEVICE HAVING MULTIPLE CONDUCTIVE LAYERS AND THE METHOD OF MANUFACTURING THE SEMICONDUCTOR DEVICE

[75] Inventors: Shoji Ariizumi; Makoto Segawa, both of Tokyo, Japan

[73] Assignee: Tokyo Shibaura Denki Kabushiki Kaisha, Kawasaki, Japan

[21] Appl. No.: 274,197

[22] Filed: Jun. 16, 1981

[30] Foreign Application Priority Data

Jun. 19, 1980 [JP] Japan .................................. 55-83136
Jun. 19, 1980 [JP] Japan .................................. 55-83137

[51] Int. Cl.[4] ...................... H01L 29/54; H01L 29/78; H01L 29/34; H01L 29/04
[52] U.S. Cl. .................................. 357/71; 357/23.11; 357/54; 357/59
[58] Field of Search .................. 357/54, 59, 71, 23 C, 357/23 CS

[56] References Cited

U.S. PATENT DOCUMENTS

| | | | |
|---|---|---|---|
| 3,510,728 | 5/1970 | Tolliver ................................. | 357/54 |
| 3,801,880 | 4/1974 | Harada et al. ........................ | 357/54 |
| 4,270,262 | 6/1981 | Hori et al ............................. | 357/54 |
| 4,278,989 | 7/1981 | Baba et al. ........................... | 357/71 S |

FOREIGN PATENT DOCUMENTS 16577 10/1980 European Pat. Off. .................. 715/

Primary Examiner—Gene M. Munson
Attorney, Agent, or Firm—Oblon, Fisher, Spivak, McClelland & Maier

[57] ABSTRACT

A semiconductor device having multiple conductive layers which are satisfactorily connected to one another is disclosed. The multiple conductive layers are respectively insulated by insulation layers and are formed on the semiconductor substrate where circuit elements are formed. Each multiple conductive layer is connected through contact holes having the same depth and at least one conductive layer is connected to the first conductive layer thereunder through an additional conductive layer formed at the same time that the second conductive layer is formed.

3 Claims, 15 Drawing Figures

SEMICONDUCTOR DEVICE HAVING MULTIPLE CONDUCTIVE LAYERS AND THE METHOD OF MANUFACTURING THE SEMICONDUCTOR DEVICE

BACKGROUND OF THE INVENTION

1. Field of the Invention

This invention relates to a semiconductor device having multiple conductive layers and more particularly to the connecting structure between one conductive layer and other conductive portions of the device. The present invention also relates to a method of manufacturing the semiconductor device.

2. Description of the Prior Art

In a semiconductor device, in particular in an intergrated circuit device, a multiple conductive-layer structure is used to form various portions of the device. In prior art devices connections to other conductive portions in this structure are achieved through contact holes simply formed by etching the insulation layers on the conductive portions to be connected. In this case, the thicknesses of the insulation layers on each conductive portion are not uniform and the number of the insulation layers differs at several portions of the device. Thus as a result of the etching process the thin portions of the device have larger holes than the thick portions because of too much side etching. In the large scale integrated circuit device (LSI), the influence of the peripheral pattern must be considered in forming the contact hole. Namely, when the contact hole is formed too large, it may cause short circuits with the peripheral conductive portions of the device or cause an increase in the coupling capacitance with the peripheral conductive portions. Thus this problem has produced many restrictions in the design of large scale integrated circuit devices.

The prior art process for forming contact holes will now be described with reference to the drawings. FIGS. 1 and 2 show the prior art process of forming the contact holes. A plurality of N+ type regions 2, 3, and 4 are formed in a P type semiconductor substrate 1. The N+ regions 2 and 3 are source and drain regions of an MOS transistor, respectively, and the N+ region 4 is a region of another MOS transistor or another circuit element. Each element formed by the N+ regions 2, 3, and 4 is separated by an element-separating layer 5 which is partially buried in the substrate 1. The separating layer 5 is made of SiO$_2$ formed by a coplanar process. A gate electrode 7 is formed over the channel between the source region 2 and the drain region 3 through a gate insulation layer 6. This gate electrode 7 is made of polycrystalline silicon (poly-Si) and is simultaneously formed along with a conductive layer 8 on the separating layer 5. The gate electrode 7 and the conductive layer 8 are covered by a first insulation layer 9 made of SiO$_2$. A contact hole is formed in the insulation layer 9. A source electrode 10', and a conductive layer 10 for connecting to another conductive layer are formed by using a photo-engraving process (PEP) and are made of poly-Si. It is natural that the other conductive layers are formed at other portions of the device at the same time. The conductive layer 10 forms the multiple conductive layer structure for the gate electrode 7 and the conductive layer 8. After the conductive layer 10 is formed, a second insulation layer 11 is formed. As shown in FIG. 2, contact hole 13 is to be formed in the second insulation layer 11, and contact holes 14 and 15 are to be formed through the first and second insulation layers 9, 11 by using a resist film 12 as a mask. In this case, the ultimate depth of the hole 13 will be t$_1$ and that of the holes 14 and 15 will be t$_2$ and t$_3$ will be greater as shown in FIG. 1. The depths t$_2$ and t$_3$ than t$_1$. Thus the hole 13 is formed first.

At the time shown in FIG. 2 the holes 14 and 15 do not yet reach the conductive layer 8 and the N+ region 4 as shown in FIG. 2. Therefore, the first insulation layer 9 must be etched further. The side etching of the hole 13 will be advanced by that etching process, and thus the hole 13 becomes larger. This may cause a short-circuit with the peripheral conductive layer and an increase in the coupling capacitance. When the side etching of the hole 13 is excessive, the resist film 12 will come off from the second insulation layer 11 and the hole 13 can not be formed in a predetermined shape. Further, there are some cases where the second poly-Si layer 10 also becomes etched.

In order to improve this situation, the prior art device of FIG. 3 was designed. This device is basically formed using the same process as that of the device of FIGS. 1 and 2. The difference is that the holes 16 and 17 are first formed in the first insulation layer by photo-engraving. By that process, the insulation layer 9 on the first conductive layer 8 and on the N+ region 4 where a hole is to be formed in a later process is only the second insulation layer 11, and the thickness of this layer is thus the same as that of the insulation layer on the second poly-Si layer 10. Thus each hole can be formed as designed and excessive margins with the peripheral conductive portions need not be prepared because only the second insulation layer 11 is etched by the photo-engraving process.

But this process requires additional steps in forming the hole in the first insulation layer 9, thus lowering production efficiency.

The prior art device of FIG. 4 has the same faults as that of the above-discussed device, also. In this device, the conductive layers 8 and 8' on the separating layer 5 are formed first and next the second conductive layer 10 is formed. Then the contact holes to the first conductive layer 8 and to the N+ region 4 are formed. In this case, as the depth t$_4$ of the insulation layer on the first conductive layer 8 is larger than the depth t$_5$ of the insulation layer on the N+ region 4, the hole on the N+ region 4 will be formed too large. So the N+ region 4 must be formed beforehand with much surplus. Further, excessive etching may cause separation of the resist film 12 and erosion of the N+ region 4.

SUMMARY OF THE INVENTION

It is an object of this invention to provide an improved semiconductor device having multiple conductive layers suitable for use as an integrated circuit device and to provide an improved method of manufacturing the device.

It is another object of this invention to provide an improved semiconductor device having contact holes whose depth is uniform without increasing the necessary processing steps and to provide an improved method of manufacturing the device.

It is another object of this invention to provide an improved semiconductor device wherein satisfactory connection between multiple conductive layers may be achieved and to provide an improved method of manufacturing the device.

It is another object of this invention to provide an improved semiconductor device having an additional conductive layer for connecting between multiple conductive layers in order to make the depths of the contact holes uniform, and to provide an improved method of manufacturing the device.

It is another object of this invention to provide an improved semiconductor device including a plurality of semiconductor elements having at least one PN junction formed on a substrate, a first insulation layer formed on the elements, a first conductive layer formed on the first insulation layer, a second insulation layer formed on the first conductive layer, a second conductive layer formed on the second insulation layer, a third insulation layer formed on the second conductive layer, and a third conductive layer formed on the third insulation layer. The third conductive layer is connected to the plural conductive portions thereunder through contact holes having the same depth and connected to at least one of the conductive layers through an additional conductive layer.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein.

DESCRIPTION OF THE PREFERRED EMBODIMENTS

Figure 1:
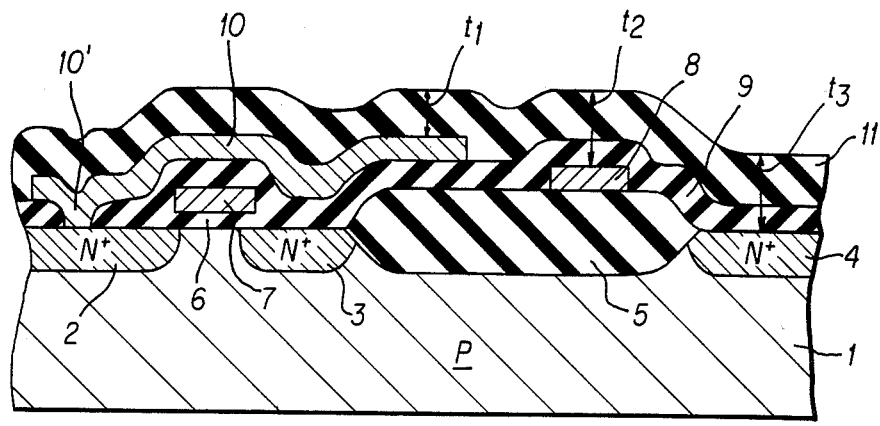
FIGS. 1 and 2 are sectional views illustrating successive steps of fabricating a prior art semiconductor device.
Figure 2:
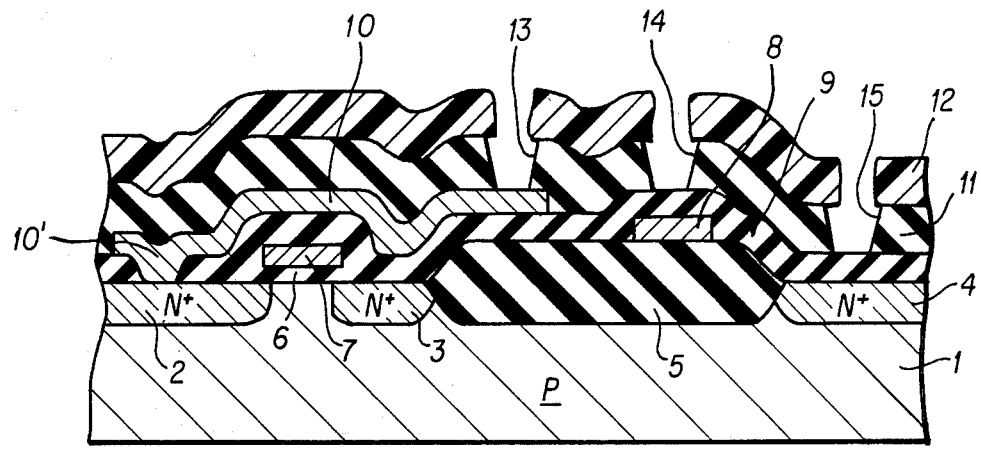
Figure 3:
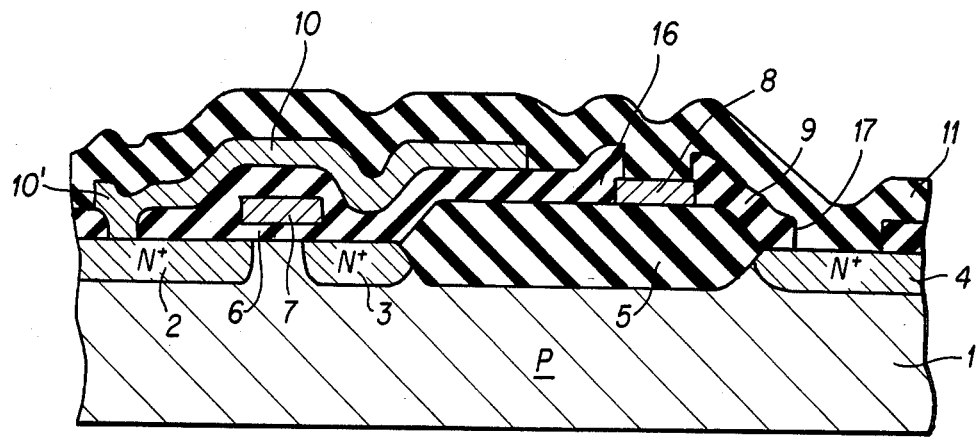
FIGS. 3 and 4 are sectional views of a prior art semiconductor device.
Figure 4:
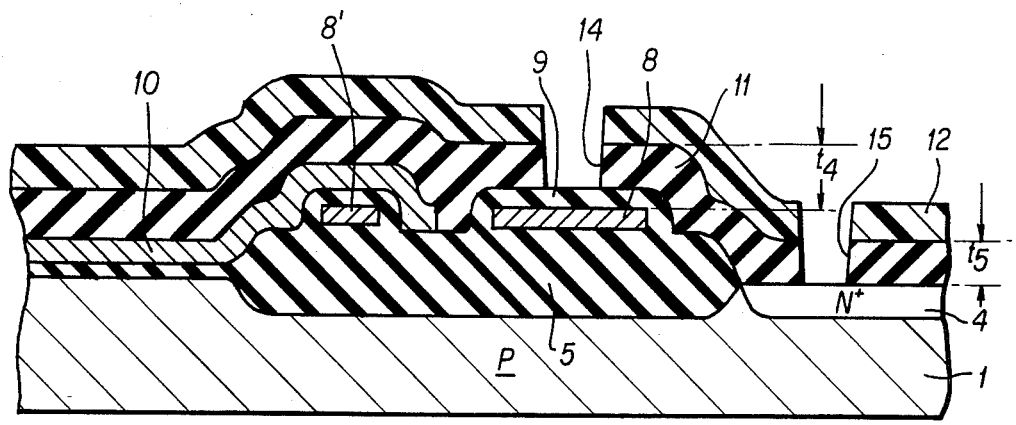

Referring now to the drawings, wherein like reference characters designate identical or corresponding parts throughout the several views, and more particularly to FIGS. 5 through 10, each Figure is a sectional view illustrating successive steps in the fabrication of the semiconductor device of first embodiment of the present invention.

Figure 5:
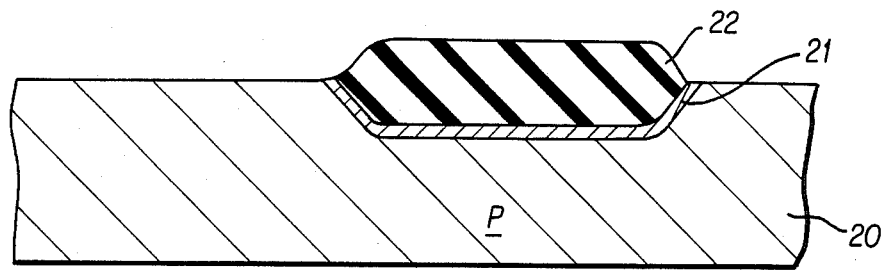
FIGS. 5 through 10 are sectional views illustrating successive steps in the fabrication of a first embodiment of the semiconductor device of the present invention.

As shown in FIG. 5, a P+ region 21, to prevent the occurrence of an inversion region on a P type semiconductor substrate 20 made of Si, is formed by implanting Boron ions using silicon-nitride ($Si_3N_4$) as a mask. Next, an element-separating layer 22 is formed using a coplanar process, which oxidizes the unmasked substrate 20. This separating layer 22 is made of $SiO_2$ and a part thereof is buried in the substrate 20. The separating layer 22 has a thickness of about 1 micron.

Figure 6:
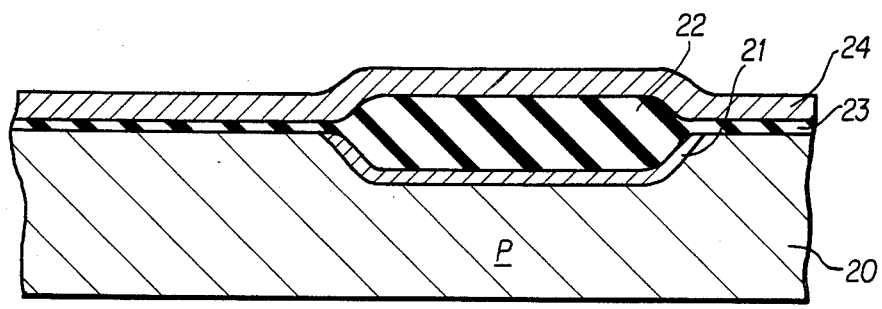

Next, a first insulation layer 23 is formed on the surface of the substrate 20 by heating the substrate 20, as shown in FIG. 6. The first insulation layer 23 has a thickness of about 300Å to 1000Å and is made of thermally grown $SiO_2$. The first insulation layer 23 will be used as a gate insulation layer. Although not shown in FIG. 6, contact holes are formed to be used for connecting with the N type region which will be formed later in the substrate 20. A first poly-Si layer 24 is formed on the surface. The first poly-Si layer 24 has a thickness of about 2000Å to 5000Å.

Figure 7:
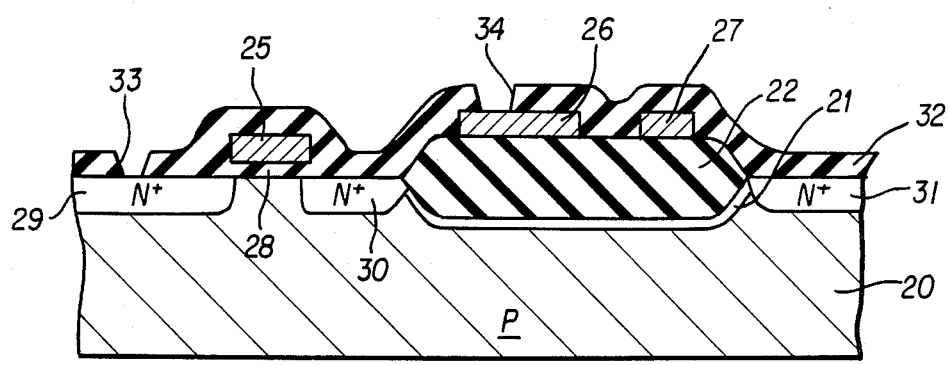

Then, a gate electrode 25, an additional conductive layer 26 to support the connection between the multiple conductive layers, and another conductive layer 27 are formed using a photo-engraving process which etches the diffused poly-Si selectively as shown in FIG. 7. Next the diffused first insulation layer 23 is etched using the remaining poly-Si layer as a mask, and a gate insulation layer 28 is formed. Simultaneously the other insulation layer on the later diffused region is also similarly etched. Impurities such as phosphorus (P) ions are diffused into the substrate 20 using the separating layer 22 and the poly-Si layer 25 as a mask. A source region 29, a drain region 30, and a N+ region 31 which is a part of another circuit element, for example a source or a drain region, are formed in this process. These impurities are also diffused into the gate electrode 25, the additional conductive layer 26, and the other conductive layer 27 in the same process. Thus the conductivity of these layers will be increased. After this process, a second insulation layer 32 is deposited on the whole surface. The second insulation layer 32 is formed by chemical vapor deposition (CVD) and has a thickness of about 2000Å to 4000Å. Next, contact holes 33 and 34 are formed by photo-engraving. The contact hole 33 can be used to form the source electrode and the contact hole 34 can be used to form an electrode for the additional conductive layer 26.

Figure 8:
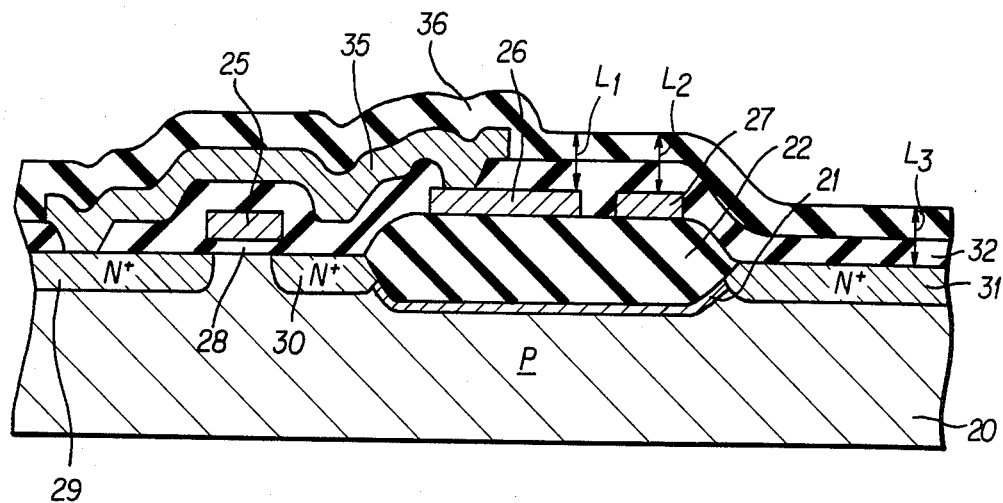
Figure 9:
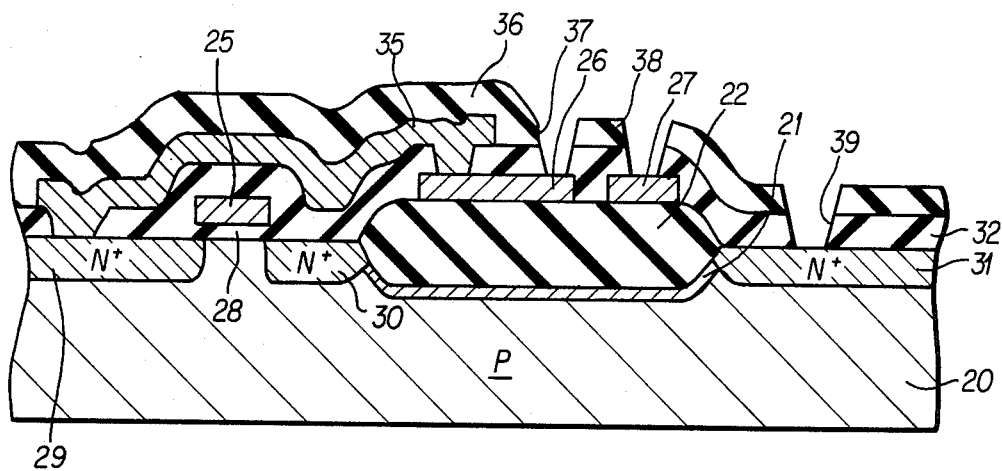
Figure 15:
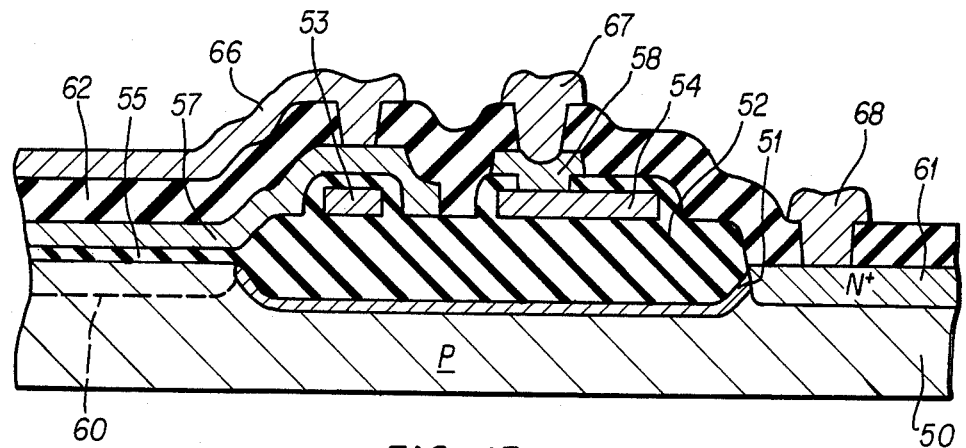
FIGS. 11 through 15 are sectional views illustrating successive steps in the fabrication of a second embodiment of the semiconductor device of the present invention.

Subsequently, a second poly-Si layer is formed on the whole surface, and a second conductive layer 35 is formed by etching the second poly-Si layer selectively as shown in FIG. 8. The second conductive layer 35 has a thickness of about 2000Å to 5000Å and is used as the source electrode. One end of the second conductive layer 35 is connected to the source region 29 and the other end is connected to the additional conductive layer 26. Next a third insulation layer 36 is formed on the second conductive layer 35 by chemical vapor deposition. The third insulation layer 36 has a thickness of about 5000Å to 10,000Å. Contact holes 37, 38 and 39 are formed on the additional conductive layer 26, the other conductive layer 27, and the N+ region 31 by using photo-engraving as shown in FIG. 9. The thicknesses $L_1$, $L_2$ and $L_3$ of each insulation layer where the contact holes 37, 38, and 39 will be formed are the same as one another, namely all of the contact holes 37, 38 and 39 have the same depth. Thus all of the contact holes 37, 38 and 39 can be formed in the same shape without over-etching or side-etching. Therefore, the influence of over-etching or side-etching need not be specially considered in the process planning and the relation with the peripheral regions can be formed as a predetermined design.

Figure 10:
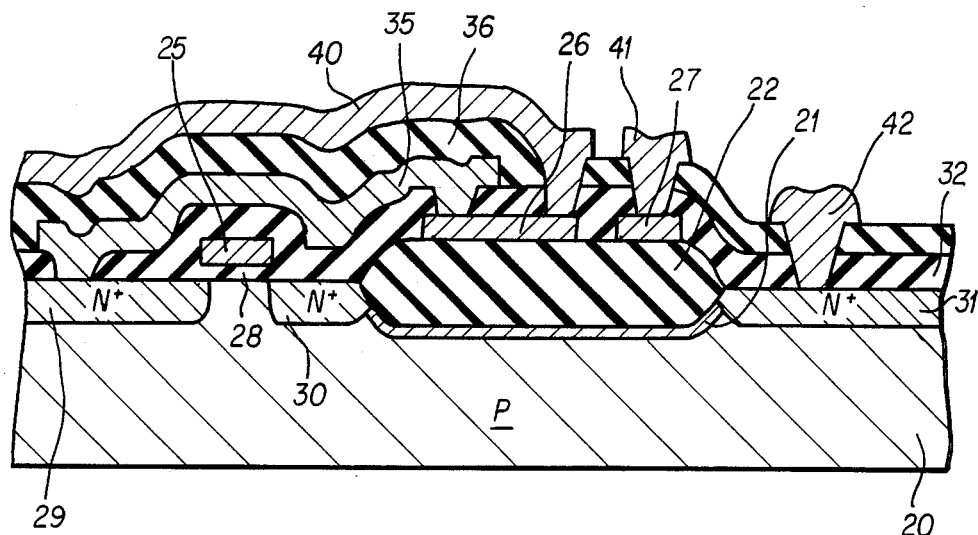
Figure 11:
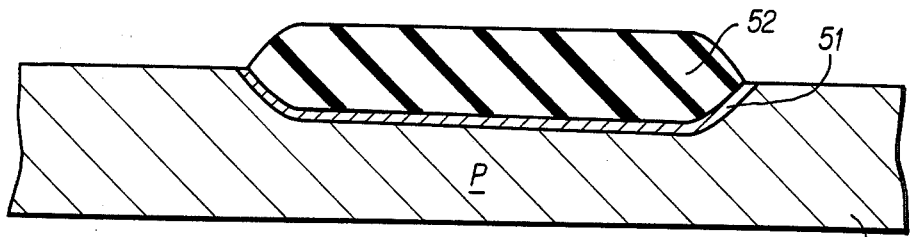

Next, an aluminium layer is covered thereon, and aluminium conductive layers 40, 41 and 42 are formed using photo-engraving as shown in FIG. 10. The aluminum conductive layers 40, 41 and 42 can be used for connecting various elements or as electrodes for external leads.

According to the above-described device, each conductive layer or portion can be connected satisfactorily and the contact holes 37, 38, and 39 can have uniform shapes and can be very precisely formed. Further the additional conductive layer can be formed at the same time as the forming of the first conductive layer 24 without an increase in the process. Problems, such as the exfoliation of the resist layer and erosion of the conductive layer under the contact holes and the N+ region, are solved.

Next, a second embodiment of the present invention will be described with reference to FIGS. 11 to 15 as follows. A first a P+ region 51 is formed on a P type silicon substrate 50 by inplanting boron ions. The P+ region 51 prevents the occurrence of an inversion region on the substrate 50. An element-separting layer 52 is formed as in the first embodiment described above. The element-separating layer 52 has a thickness of about one micron and is made of $SiO_2$.

Figure 12:
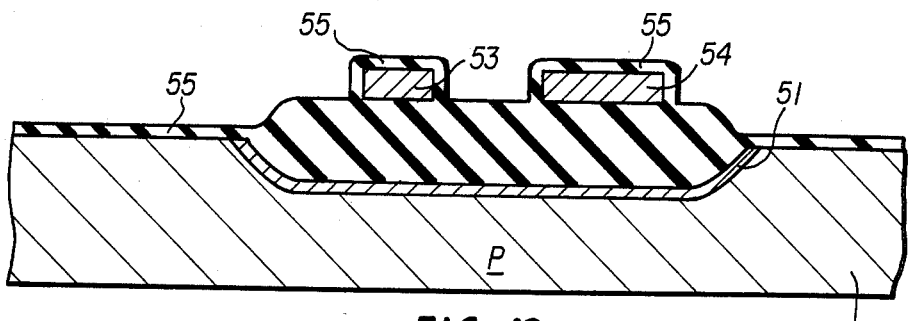

Next, a poly-Si layer is formed having a thickness of about 2000Å to 4000Å thereon. First conductive layers 53 and 54 are formed on the separating layer 52 by using photo-engraving as shown in FIG. 12. A first insulating layer 55 is formed on all of the surface of the device including the first conductive layers 53 and 54 through a thermal oxidation process. The insulation layer 55 has a thickness of about 400Å to 1000Å.

Figure 13:
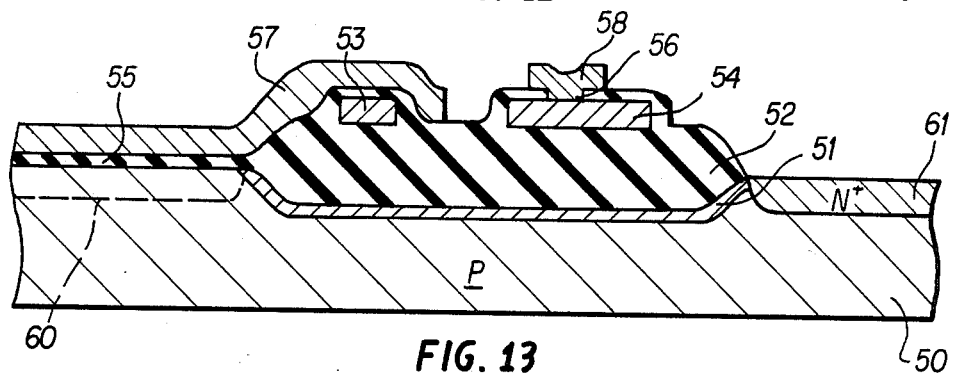

As shown in FIG. 13, a contact hole 56 to the conductive layer 54 is formed by photo-engraving. The contact hole 56 is formed at the same time as another contact hole for connecting to the other conductive layer or for connecting to a portion of the substrate 50. A Poly-Si Layer is formed on its surface. The poly-Si layer has a thickness of about 2000Å to 5000Å. Next, a second conductive layer 57 and an additional conductive layer 58 are formed by photo-engraving. The second conductive layer 57 can be used as the gate electrode of an MOS transistor and the additional conductive layer 58 is used as the medium to connect with the other conductive layer. Next, a portion of the insulation layer 55 is etched using the conductive layer 57 as a mask. N+ regions 60 and 61 are formed by diffusing impurities of phosphorus ions into the substrate 50. The N+ region 60 is the source or drain region of the MOS transistor and the N+ region 61 is a part of another element, such as, for example the source or the drain region of another MOS transistor.

Figure 14:
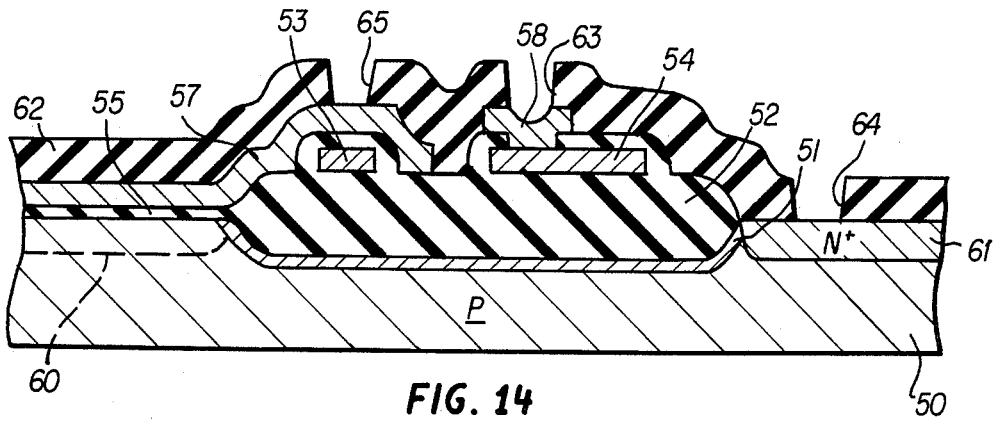

Next a second insulation layer 62 is formed on the surface as shown in FIG. 14. The second insulation layer 62 is made of $SiO_2$, and has a thickness of about 5000Å to 10,000Å. Contact holes 63, 64, and 65 are formed in the second insulation layer 62 by photo-engraving. In this case, the depths of the holes 63, 64, and 65 are respectively the same, so the holes 63, 64 and 65 can be formed very precisely. Further, as the thickness of the insulation layer is constant, side-etching or over-etching can be restrained and the erosion of the additional conductive layer 58 and the N+ region 61 can be restrained, also.

Next, an aluminium layer is formed on the surface and aluminium conductive layers 66 and 67 are formed by photo-engraving as shown in FIG. 10. The aluminium layers 66, 67, and 68 can be used for connecting with other elements or as electrodes for the external leads.

In the above-described process, in order to make the depths of the contact holes uniform, the additional conductive layer 58 can be formed at the same time as the forming of the second conductive layer 57 without requiring additional processing. In the semiconductor device according to present invention, all of the contact holes, formed simultaneously, have the same depth, so the shape of the contact holes is uniform and the contact holes can be formed very precisely.

Obviously, many modifications and variations of this invention are possible in the light of the above teachings. It is therefore to be understood that within the scope of the appended claims, this invention may be practiced otherwise than as specifically described herein.

What is claimed as new and desired to be secured by Letters Patent of the United States is:

1. A semiconductor device comprising:
    a plurality of semiconductor elements having at least one PN junction, said elements being formed on a substrate;
    an insulating separating layer imbedded in a portion of said substrate and raised above the surface thereof for separating, below the surface of the substrate, at least two of said semiconductor elements;
    a first insulation layer formed on said substrate;
    a first conductive layer comprising,
    a first electrode formed on said first insulation layer,
    an additional conductive layer formed on said insulating separating layer, and
    another conductive layer formed on said insulating separating layer;
    a second insulation layer formed on said first conductive layer;
    a second conductive layer formed on said second insulation layer;
    a third insulation layer formed above said second insulation layer;
    a third conductive layer formed on said third insulation layer, said third conductive layer being connected by a plurality of separate conductive paths to said semiconductor elements in said semiconductor device through contact holes, every such contact hole passing through the same number of said layers of insulation, said separate conductive paths including said additional conductive layer, said third conductive layer connected to said another conductive layer and said additional conductive layer through said contact holes and to said second conductive layer through said additional conductive layer.

2. A semiconductor device as recited in claim 1, wherein:
    said third conductive layer is connected to a semiconductor region of one of said semiconductor elements through one of said contact holes and is further connected to said additional conductive layer through another of said contact holes.

3. A semiconductor device as recited in one of claims 2 or 1, wherein:
    said first conductive layer and said second conductive layer are made of polycrystalline silicon and said third conductive layer is made of aluminum.

* * * * *